United States Patent [19]
Hunt

[11] Patent Number: 5,657,204
[45] Date of Patent: Aug. 12, 1997

[54] PC ADD-ON BOARD INSTALLATION APPARATUS FOR INDUSTRIAL APPLICATIONS

[75] Inventor: Steven David Hunt, Freehold, N.J.

[73] Assignee: Paradyne Corporation, Largo, Fla.

[21] Appl. No.: 711,511

[22] Filed: Sep. 10, 1996

[51] Int. Cl.⁶ .................. H05K 7/14; H05K 7/16
[52] U.S. Cl. .............. 361/752; 361/801; 361/802; 439/64; 439/377
[58] Field of Search ................ 361/683, 684, 361/685, 686, 724, 726, 727, 736, 737, 732, 740, 741, 747, 752, 754, 756, 759, 796, 798, 801, 802; 439/64, 160, 342, 377; 364/708.1

[56] References Cited

U.S. PATENT DOCUMENTS 5,224,019  6/1993  Wong et al. .................. 361/685
5,373,133  12/1994  Brockway .................... 361/801
5,535,100  7/1996  Lubahn et al. ................ 361/752

*Primary Examiner*—Leo P. Picard
*Assistant Examiner*—Anthony Dinkins
*Attorney, Agent, or Firm*—Thomas, Kayden, Horstemeyer & Risley

[57] ABSTRACT

The apparatus includes a movable card guide mechanism for receiving a PC add-on board. The movable card guide mechanism moves vertically to seat the add-on board in, or remove the add-on board from, a bus connector when an external latch is moved inward or outward. The external latch is attached to the movable card guide mechanism by means of an actuator, and the movable card guide mechanism is mounted to the inside top wall of the PC's chassis. Thus, when the actuator moves in one direction, the movable card guide mechanism is moved down, seating the edge connector of an add-on board in a bus connector on the PC's motherboard, and when it moves in the other direction, the movable card guide mechanism is moved up, removing the add-on board from the bus connector.

8 Claims, 3 Drawing Sheets

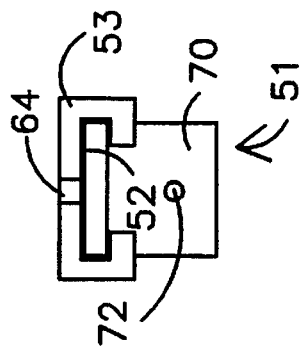
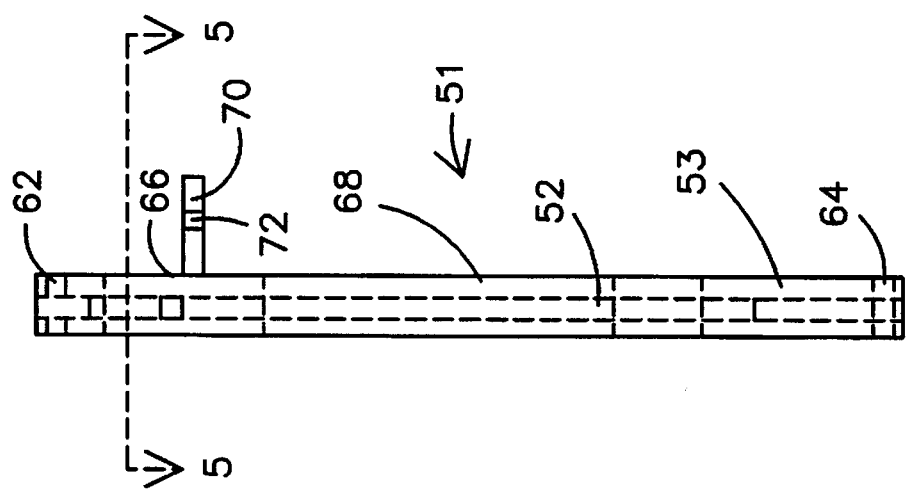
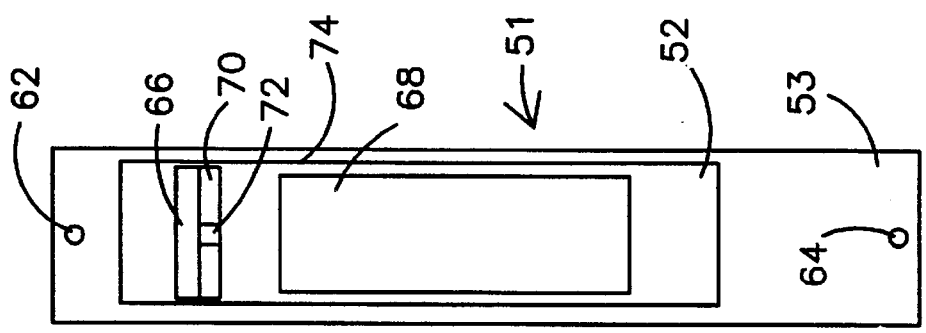

PC ADD-ON BOARD INSTALLATION APPARATUS FOR INDUSTRIAL APPLICATIONS

BACKGROUND OF THE INVENTION

The present invention relates to an apparatus which can be used to install add-on boards in a personal computer ("PC"). In particular, the present invention relates to an apparatus which is particularly well adapted for adding boards to PCs used in industrial environments, such as a rack-mounted PCs.

In industrial environments, it is common to have rack-mounted equipment. Such equipment typically includes a card receiving mechanism which permits boards to be slid directly into a rack-mounting cage adapted to receive and properly seat such cards, so that they achieve proper mechanical and electrical contact. There are presently a variety of standards which are used for rack-mounting equipment and cards associated with such equipment.

A problem which exists, however, is that since 1981, when IBM introduced its first PC which had an open architecture, the PC has been a catalyst for numerous manufacturers to produce a huge variety of add-on boards which are compatible with the PC architecture and software. While it would be virtually impossible to list the types of add-on boards which are presently available, they include memory boards, I/O boards, analog-to-digital converters, digital-to-analog converters, boards for interfacing a variety of displays, boards for interfacing a variety of serial and parallel devices, boards for interfacing a variety of disk drives, tape drives, CD-ROMs, etc.

In view of the availability of such a wide variety of add-on boards, and in view of the numerous languages, applications, and operating systems available for use on PCs, their use in both business and industrial environments is common and desirable. A problem with PC designs, though, has always been that the add-on or plug-in cards which are designed to be plugged into bus connectors on a PC's motherboard, were not designed from the beginning to be compatible with rack-mounted equipment. In particular, the PC plug-in cards which are commonly used are designed to be slid vertically downward into a bus connector located in a slot on the PC's motherboard, while the actual motherboard has a horizontal orientation.

The installation of an add-on board to a PC is typically accomplished by first removing the cover from the PC. This is usually accomplished by first removing screws from the rear of the PC which attach the cover to the PC's chassis. With the cover removed, a metal slot cover which is associated with an available slot is removed by first removing a screw which holds it in place, thereby exposing a vertically oriented opening at the rear of the PC's chassis. Then, an edge connector on the add-on board is inserted into a card edge connector (or "PC bus connector") which faces up from the motherboard. The act of inserting the edge connector of the add-on board into the card edge connector simultaneously places any external connectors, which are on the rear edge of the add-on board, through the (now exposed) slot opening on the rear of the chassis which is associated with that motherboard slot. Then, the screw which was removed to free the metal slot cover is replaced, thereby securing the add-on board in position. Next, the cover is replaced on the chassis, and it is screwed back into place. Finally, any cables which must be connected to any external connector on the rear edge of the add-on board (which extends through the PC's chassis), are connected, and the PC is returned to service.

In view of the possibility of dropping a screw when removing the slot cover, or when installing the add-on board, virtually all manufacturers of add-on boards advise the installer to remove power from the PC prior to performing any of the foregoing steps.

While the foregoing procedure is commonly done on desktop PCs, it is a difficult procedure to implement in a rack-mounted PC, of the type used in industrial applications, as it requires sufficient vertical space above the rack slot for the add-on card to be appropriately positioned for insertion into the PC bus connector, and for the removal and reinstallation of the slot cover screw.

A further problem with the installation of add-on cards in rack-mounted PCs is that any required external connectors, such as RS-232 connectors, have to be plugged into the appropriate connector on the PC card faceplate after the add-on board has been installed in the PC, the PC cover has been reinstalled on the chassis, and the PC has been reinstalled in the rack-mount, as required for appropriate electromagnetic interference ("EMI") protection.

Yet another problem with the procedure described, is that it is sometimes desirable to be able to add or remove add-on boards without first removing power from the PC. As set forth above, due to the possibility of dropping the slot cover screw, this procedure, if performed on a "hot" chassis, can be extremely dangerous to the PC.

SUMMARY OF THE INVENTION

In accordance with the preferred embodiment of the invention, an apparatus is provided for use in mounting an add-on board in a PC, such as an industrial, rack-mounted PC. The apparatus includes a chassis which houses a PC motherboard. The motherboard has at least one vertically oriented bus connector installed on it. The chassis has a rear wall which has an opening which extends through it, so that any external connector which is on an add-on board can extend through the opening in the chassis. The invention includes a movable card guide mechanism for slidably receiving an add-on board. The movable card guide mechanism is adapted for vertical movement, relative to the chassis. Thus, if an add-on board is received by the movable card guide mechanism when it is in its highest vertical position, the edge connector on the add-on board will be clear of the bus connector on the motherboard. When the movable card guide mechanism is moved to its lowest vertical position, the edge connector on the add-on board will be seated in the bus connector on the motherboard. The movable card guide mechanism is mounted on the upper wall of the PC chassis using hinges which raise and lower the movable card guide mechanism when a latch, external to the chassis, is pulled out or pushed in. In the preferred embodiment of the invention, the latch is attached to the hinges on the movable card guide mechanism by means of an actuator which moves with the latch.

In accordance with a preferred embodiment of the invention, the latch is fixed to the outside of the chassis by a hinge. When the latch is pushed in, the actuator moves in, pushing the hinges in and lowering the add-on board's edge connector into the PC's motherboard bus connector, thereby establishing both mechanical and electrical connection of the add-on board's edge connector to the motherboard's bus connector. Similarly, when the latch is pulled out, the actuator moves out, moving the hinges out and raising the add-on board's edge connector out of the PC's motherboard bus connector.

BRIEF DESCRIPTION OF THE DRAWINGS

In the Drawing:

FIG. 3 is a rear view of the chassis faceplate used with the present invention;

FIG. 4 is a side view of the chassis faceplate of FIG. 3; and

FIG. 5 is a top view of the chassis faceplate of FIG. 3 taken along the line 5—5 of FIG. 4.

DETAILED DESCRIPTION OF THE PREFERRED EMBODIMENT OF THE INVENTION

Figure 1:
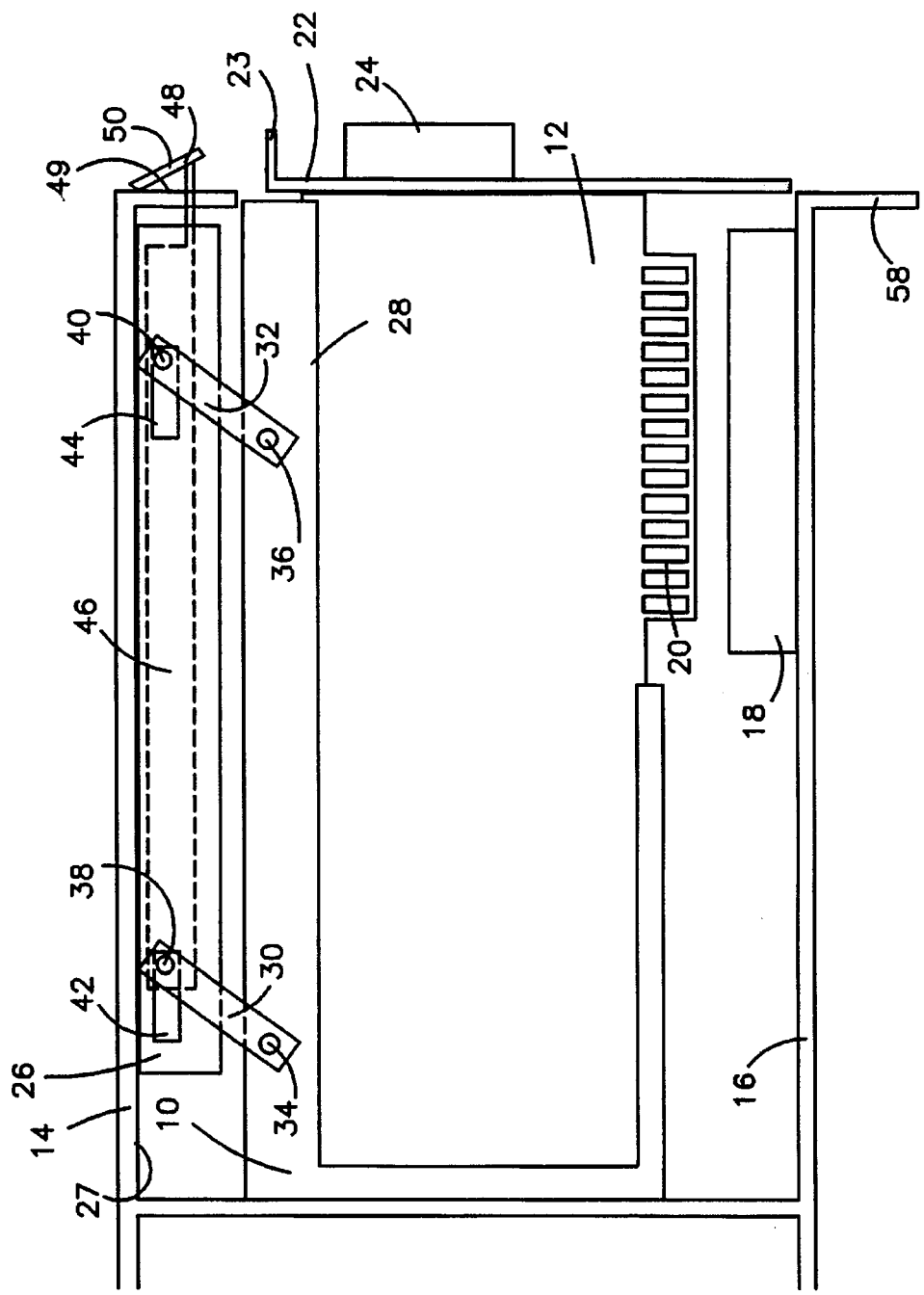
FIG. 1 illustrates a side view of the preferred embodiment of the present invention with the edge connector of an add-on board in position to be inserted into a bus connector on a PC motherboard.
Figure 2:
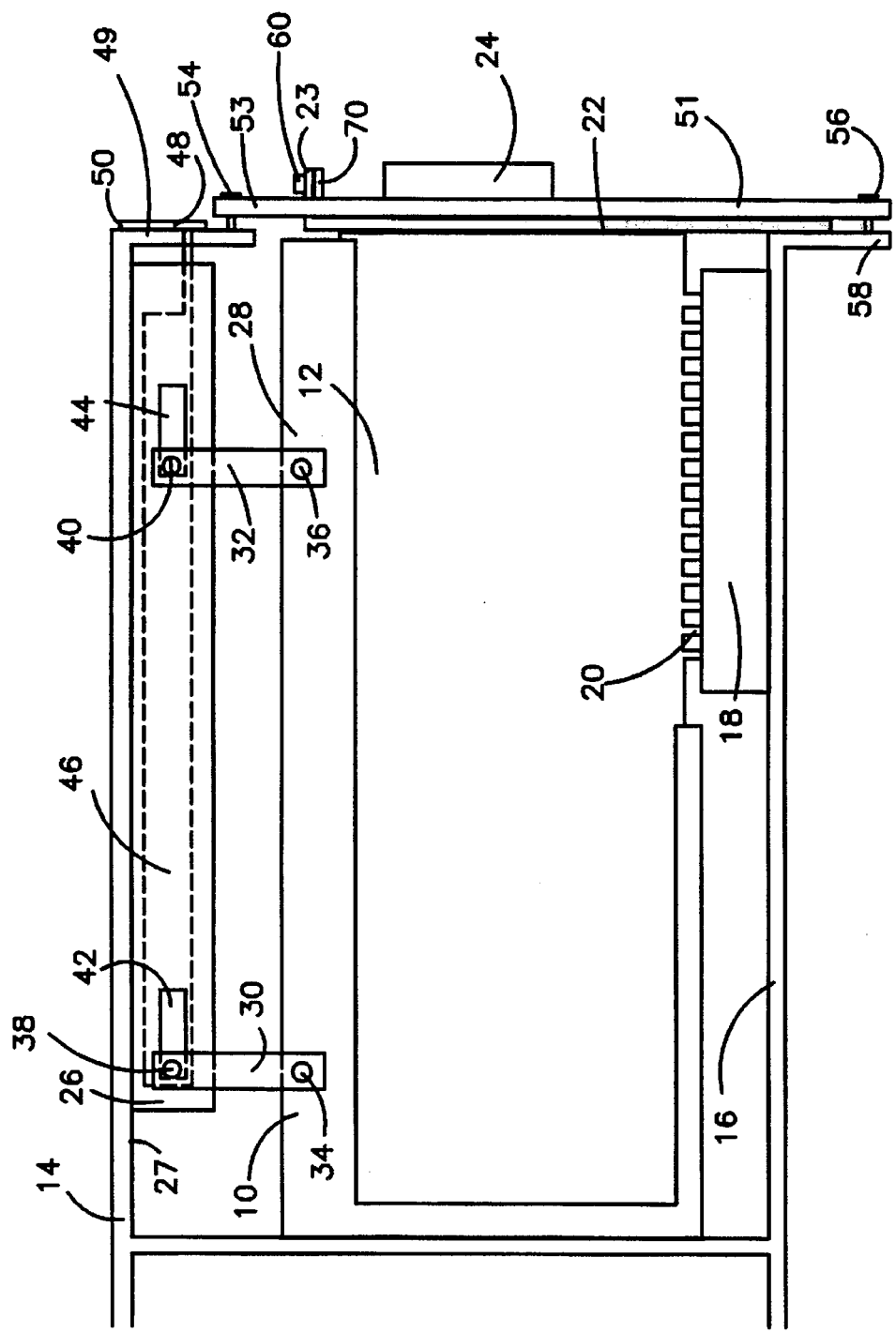
FIG. 2 illustrates a side view of the preferred embodiment of the present invention with the edge connector of the add-on board of FIG. 1 inserted into the bus connector on the PC motherboard.

Referring now to FIGS. 1 and 2, the present invention is a movable card guide mechanism 10 for installing a PC add-on card 12 into a rack-mounted PC. As illustrated in FIG. 1, the rack-mounted PC includes a chassis 14 in which a motherboard 16 is mounted. The motherboard 16 includes at least one PC bus connector 18 which is adapted to receive a card edge connector 20 which is part of the standard PC add-on card 12. The PC add-on card 12 further includes a faceplate 22 on which any external connectors, such as connector 24, are located. The faceplate 22 includes an upper lip 23.

In accordance with the present invention, the movable card guide mechanism 10 includes a linkage mounting means 26 which is mounted to an upper wall 27 of the PC chassis 14. The linkage mounting means 26 is used to raise (See FIG. 1) and lower (See FIG. 2) a movable card guide 28 which is attached to the linkage mounting means 26 by pivoting means, such as arms 30, 32.

As illustrated in FIGS. 1 and 2, the arms 30, 32 are pivotally connected to the movable card guide 28 at pivots 34, 36, respectively. The arms 30, 32 are slidably connected to the movable card guide mechanism 26 at pivot points 38, 40, which slide within slots 42, 44, respectively, in the preferred embodiment of the invention. The pivot points 38, 40 are attached to a linkage arm 46 which has one end attached to a latch mechanism 48 which is hingedly mounted to the rear wall 49 of the PC chassis 14 using a hinge 50.

In operation, a chassis faceplate 51 (not shown in FIG. 1 for clarity), which is preferably comprised of an inner chassis faceplate 52 and an outer chassis faceplate 53 (See FIGS. 3–5), is used to cover each individual slot of the PC chassis 14. In order to install the add-on card 12, the chassis faceplate 51 is removed from the rear of the PC chassis 14 by removing screws 54, 56.

As described above, in the preferred embodiment of the invention, the chassis faceplate 51 is comprised of an outer chassis faceplate 53 (See FIG. 5) which forms a channel around, and retains, the inner chassis faceplate 52. This arrangement permits the inner chassis faceplate 52 to slide within the channel formed in the outer chassis faceplate 53, so that when the outer chassis faceplate 53 is screwed into the rear of the chassis 14, using a pair of screws 54, 56, as shown in FIG. 2, it acts as a guide to help insure that the add-on card 12 is moved vertically into proper position in the connector 18 on the motherboard 16. Prior to placing the add-on card 12 into the chassis 14, the lip 23 on the add-on card 12 is attached to a lip 70 which is formed on the inner chassis faceplate 52, thereby securing the add-on card 12 to the chassis faceplate assembly 51.

Accordingly, to insert an add-on card 12 into the chassis 14, the screws 54, 56 which retain the chassis faceplate assembly 51, are removed, thereby exposing the movable card guide 28 into which the PC add-on card 12 is to be inserted. Then, the add-on card 12 is attached to the chassis faceplate assembly 51 by screwing the lip 23 of the add-on card 12 to the lip 70 of the inner chassis faceplate 52, using screw 60, which screws into the hole 72 which is tapped into the lip 70 of the inner chassis faceplate 52. Next, the add-on card 12, with the chassis faceplate assembly 51 attached, is simply slid into the movable card guide 28 from the rear of the PC. Using the present invention, any cables which have to be attached to the add-on card's external connector 24 may be attached when the add-on card 12 is slid into the movable card guide 28, i.e., while the add-on card 12 is still outside of the chassis 14 where it is readily accessible.

After the add-on card 12 has been inserted into the movable card guide 28, the chassis faceplate assembly 51 is screwed into the rear of the chassis 14 using screws 54, 56 (See FIG. 2), and then the latch 48 is pressed toward the rear wall 22 of the PC chassis 14, thereby causing the latching apparatus 46 to slide toward the front of the PC chassis 14. As the linkage arm 46 slides forward, the arms 30, 32 are caused to pivot, as shown in FIG. 2. When the latch 48 has been fully depressed, the arms 30, 32 will be forced to extend downward, whereby the add-on card 12 will be properly aligned so that its edge connector 20 is properly seated in the PC bus connector 18, thereby providing both mechanical and electrical connections between the add-on card 12 and the motherboard 16 through the bus connector 18. As set forth above, the two piece chassis faceplate assembly 51 assists in the proper alignment of the add-on card into the connector 18, as it insures that the card must move straight down vertically.

With reference to FIGS. 3–5, the chassis faceplate 51 is shown to include a pair of holes 62, 64 through which the screws 54, 56, respectively are mounted. The inner chassis faceplate 52 includes a slot 66, through which the lip 23 (See FIGS. 1 and 2) of the add-on card 12 is fitted, and an opening 68, through which the connector 24 of the add-on card 12 is fitted. There is a lip 70 on the inner chassis faceplate 52 which preferably contains a hole 72 which has been tapped to receive the screw 60 (See FIG. 2). As shown in FIG. 3, an opening 74 is formed in the outer chassis faceplate 53.

As illustrated, the use of the present invention obviates any need for additional vertical space above the PC chassis 14 as was heretofore required. In addition, as the PC card faceplate attaches to the chassis faceplate in a separate step from the attachment of the PC add-on card 12 to the PC bus connector 18, as was heretofore done, it is possible to attach any external cabling to the external connector 24 while the PC add-on card 12 is still outside of the PC chassis 14.

I claim:

1. A mounting mechanism for use in mounting an add-on board in a personal computer comprising:

(a) a chassis which houses a motherboard, said motherboard having at least one vertically oriented bus connector installed thereon, said chassis having an opening on a rear wall thereof for receiving any external connector which may be present on the add-on board;

(b) a movable card guide mechanism for slidably receiving an add-on board, said movable card guide mechanism being adapted for vertical movement, whereby an add-on board which has been received by said movable card guide mechanism when said movable card guide mechanism is in its highest vertical position will be clear of said bus connector and whereby an edge connector on an add-on board which has been received by said movable card guide mechanism when said movable card guide mechanism is in its lowest vertical position will be seated in said bus connector when said movable card guide mechanism is in its lowest vertical position;

(c) linkage means for mounting said movable card guide mechanism to an upper wall of said chassis, said mounting means including pivoting means for raising and lowering said movable card guide mechanism;

(d) latch means, external to said chassis, said latch means being attached to said hinge means by an actuator, whereby when said latch means is moved in a first direction, said actuator causes said movable card guide mechanism to be lowered, and when said latch means is moved in a second direction, said actuator causes said movable card guide mechanism to be raised.

2. The mounting mechanism of claim 1, wherein said pivoting means for mounting said movable card guide mechanism to said linkage means comprises a pair of arms.

3. The mounting mechanism of claim 2, wherein said pair of arms is pivotally attached to said movable card guide.

4. The mounting mechanism of claim 3, wherein said pair of arms is pivotally attached to said movable card guide by a pair of rivets.

5. The mounting mechanism of claim 4, wherein said pair of arms is pivotally attached to said linkage means by a pair of rivets which slide within slots in said linkage means, whereby as said rivets slide within said slots, and as said arms pivot on said rivets, said movable card guide mechanism is able to slide vertically.

6. The mounting mechanism of claim 1, further comprising a chassis faceplate which is adapted to be connected to said chassis and to a lip which is formed on an add-on card.

7. The mounting mechanism of claim 6, wherein said chassis faceplate contains a slot to receive a lip formed on an add-on card.

8. The mounting mechanism of claim 7, wherein said chassis faceplate contains a lip which is adapted to receive a screw which extends through a lip formed on an add-on card, whereby an add-on card can be secured to said chassis faceplate.

* * * * *